US008921889B2

(12) United States Patent
Bamba (10) Patent No.: US 8,921,889 B2
(45) Date of Patent: Dec. 30, 2014

(54) SEMICONDUCTOR DEVICE (71) Applicant: Kosuke Bamba, Toyota (JP)

(72) Inventor: Kosuke Bamba, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 14/091,954

(22) Filed: Nov. 27, 2013

(65) Prior Publication Data
US 2014/0159109 A1 Jun. 12, 2014

(30) Foreign Application Priority Data

Dec. 11, 2012 (JP) ................................. 2012-270003

(51) Int. Cl.
H01L 29/08 (2006.01)
H01L 27/07 (2006.01)
H01L 29/06 (2006.01)
H01L 29/04 (2006.01)
H01L 29/739 (2006.01)

(52) U.S. Cl.
CPC ........ *H01L 29/0834* (2013.01); *H01L 29/0607* (2013.01); *H01L 29/04* (2013.01); *H01L 29/7395* (2013.01); *H01L 27/0716* (2013.01)
USPC .......................................... 257/140

(58) Field of Classification Search
CPC ............ H01L 29/0834; H01L 27/0716; H01L 29/7395; H01L 29/0607; H01L 29/04
USPC ........................................... 257/140
See application file for complete search history.

(56) References Cited

U.S. PATENT DOCUMENTS

2006/0278925 A1* 12/2006 Yamaguchi .................... 257/341
2010/0140658 A1* 6/2010 Koyama et al. ................ 257/140

FOREIGN PATENT DOCUMENTS

JP A-2011-129619 6/2011

* cited by examiner

Primary Examiner — Walter H Swanson
(74) Attorney, Agent, or Firm — Oliff PLC

(57) ABSTRACT

A semiconductor device includes a semiconductor substrate on which a diode region and an IGBT region are formed. The diode region of the semiconductor substrate includes a first conductive type specific semiconductor region that is formed in a portion of an area facing a front surface of the semiconductor substrate, a second conductive type anode region that is formed in another portion of the area facing the front surface of the semiconductor substrate and is formed along a lower side of the specific semiconductor region, and a first conductive type diode drift region that is formed on a lower side of the anode region. The specific semiconductor region is separated from the diode drift region by the anode region, and is electrically connected to the trench gate electrode.

4 Claims, 6 Drawing Sheets

SEMICONDUCTOR DEVICE

INCORPORATION BY REFERENCE

The disclosure of Japanese Patent Application No. 2012-270003 filed on Dec. 11, 2012 including the specification, drawings and abstract is incorporated herein by reference in its entirety.

BACKGROUND OF THE INVENTION

1. Field of the Invention

The invention relates to a semiconductor device. More particularly, the invention relates to a semiconductor device in which a diode region and an insulated gate bipolar transistor (hereinafter, IGBT) region are formed on the same semiconductor substrate.

2. Description of Related Art

Japanese Patent Application Publication No. 2011-129619 (JP 2011-129619 A), for example, describes a semiconductor device in which a diode region and an IGBT region are formed on the same semiconductor substrate. In this semiconductor device, a crystal defect region is formed in a drift region of the diode region. When a reverse recovery operation is performed in the diode region, carriers in the drift region recombine with crystal defects in the crystal defect region and disappear, thus making it possible to improve the switching speed.

With the semiconductor device described in JP 2011-129619 A, while the diode region is off and the IGBT region is on, some carriers within the drift region may flow into an anode region, and leak current may flow into the diode region. Also, if a large number of carriers are generated from the crystal defect region due to a temperature increase or the like, a large leak current may flow to the diode region.

SUMMARY OF THE INVENTION

The invention thus provides a semiconductor device capable of inhibiting leak current from being generated.

One aspect of the invention relates to a semiconductor device including a semiconductor substrate. This semiconductor device includes an IGBT region that includes a first conductive type emitter region formed in an area facing a front surface of the semiconductor substrate, a second conductive type body region formed on a lower side of the emitter region, a first conductive type IGBT drift region formed on a lower side of the body region, a gate insulating film that covers an inside wall of a gate trench extending from the front surface of the semiconductor substrate to the IGBT drift region, and contacts the emitter region, and a trench gate electrode arranged inside the gate insulating film; and a diode region that includes a first conductive type specific semiconductor region that is formed in a portion of an area facing the front surface of the semiconductor substrate and is electrically connected to the trench gate electrode, a second conductive type anode region that is formed in another portion of the area facing the front surface of the semiconductor substrate and is formed along a lower side of the specific semiconductor region, and a first conductive type diode drift region that is formed on a lower side of the anode region and is separated from the specific semiconductor region by the anode region.

According to the aspect described above, leak current is able to be inhibited from being generated.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

In the invention, a gate trench, a gate insulating film, and a trench gate electrode may be formed along an IGBT region and a diode region. A specific semiconductor region may be formed in an area not adjacent to the gate insulating film in the diode region.

According to this structure, the same potential as that of the trench gate electrode is applied to the specific semiconductor region, but the specific semiconductor region is formed in an area that is not adjacent to the gate insulating film of the diode region. Therefore, when the IGBT region is on (i.e., when an on-potential is applied to the gate electrode), a channel will not form in the diode region. Therefore, even if the same potential as that of the trench gate electrode is applied to the specific semiconductor region, it is possible to inhibit the semiconducting properties of the IGBT region from being affected by this.

In the invention, an anode region may include a first anode region formed in at least a portion of another portion of an area facing a front surface of the semiconductor substrate, and a second anode region formed on a lower side of the first anode region. A second conductive type impurity concentration of the first anode region may be higher than a second conductive type impurity concentration of the second anode region. A position of a lower end portion of the specific semiconductor region may also be lower than a position of a lower end portion of the first anode region.

According to this structure, while the diode region is off and the IGBT region is on, a depletion layer formed between the specific semiconductor region and the anode region is easily formed below the first anode region. As a result, it is possible to effectively inhibit carriers from flowing into the first anode region.

In the invention, a crystal defect region may be formed in a diode drift region. A crystal defect density of the crystal defect region may be higher than a crystal defect density of a region other than the crystal defect region, of the diode drift region.

According to this structure, when a reverse recovery operation of the diode region is performed, carriers in the diode drift region recombine with crystal defects in the crystal defect region and disappear, which makes it possible to improve the switching speed. Also, while the diode region is off and the IGBT region is on, even if carriers are generated from the crystal defect region due to a temperature increase or the like, movement of the carriers is able to be blocked by the depletion layer formed between the specific semiconductor region and the anode region. Therefore, with the structure described above, it is possible to inhibit leak current from being generated, while improving the switching speed.

(First Example Embodiment)

Figure 1:
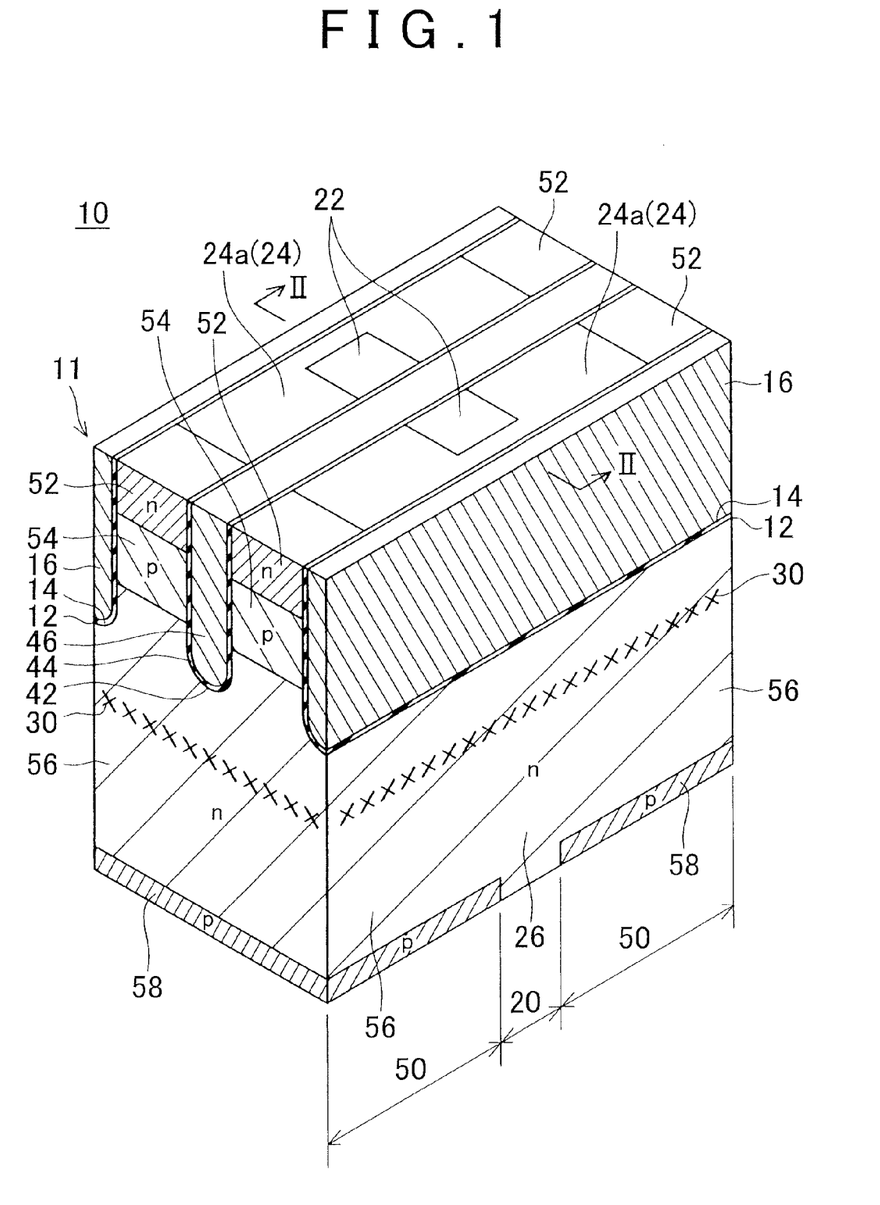
FIG. 1 is a sectional perspective view of the main portions of a semiconductor device according to a first example embodiment of the invention.

As shown in FIG. 1, a semiconductor device 10 according to a first example embodiment of the invention includes a semiconductor substrate 11 mainly made of Si, and an insulating layer, electrodes, and metal wiring and the like, none of which are shown, formed on front and back surfaces of the semiconductor substrate 11. An IGBT region 50 and a diode region 20 are formed on the semiconductor substrate 11. In this example embodiment, a front surface electrode, not shown, is formed along the entire front surface (i.e., the upper surface in FIG. 1) of the semiconductor substrate 11, and a back surface electrode, also not shown, is formed along the entire back surface (i.e., the lower surface in FIG. 1) of the semiconductor substrate 11.

Two gate trenches 12, gate insulating films 14, and trench gate electrodes 16 are provided in the semiconductor substrate 11. Whenever possible in this specification, portions such as the gate trenches 12, the gate insulating films 14, and the trench gate electrodes 16 and the like that are provided in plurality will be referred to in the singular to facilitate understanding. The gate insulating film 14 covers the inside of the gate trench 12. The trench gate electrode 16 is housed in the gate trench 12, in a state covered by the gate insulating film 14. Also, one dummy trench 42, dummy insulating film 44, and dummy electrode 46 are provided between the two gate trenches 12. The dummy insulating film 44 covers the inside of the dummy trench 42. The dummy electrode 46 is housed inside the dummy trench 42, in a state covered by the dummy insulating film 44.

In this example embodiment, the IGBT region 50 and the diode region 20 are arranged alternately in a longitudinal direction of the gate trench 12 and the dummy trench 42.

An emitter region 52, a body region 54, an IGBT drift region 56, a collector region 58, the two trench gate electrodes 16, and the dummy electrode 46 are formed in the IGBT region 50.

The emitter region 52 is an n-type semiconductor region that is formed in an area facing a front surface of the semiconductor substrate 11. The emitter region 52 is formed in an area contacting both the gate insulating film 14 in the gate trench 12, and the dummy insulating film 44 in the dummy trench 42. An upper surface of the emitter region 52 is ohmically connected to the front surface electrode, not shown.

The body region 54 is a p-type semiconductor region that is formed on a lower side of the emitter region 52. A position of a lower end portion of the body region 54 is higher than both a position of a lower end portion of the gate trench 12 and a position of a lower end portion of the dummy trench 42.

The IGBT drift region 56 is an n-type semiconductor region that is formed on a lower side of the body region 54. The IGBT drift region 56 is separated from the emitter region 52 by the body region 54. A crystal defect region 30 is formed in the IGBT drift region 56. The crystal defect region 30 is formed along a plane that is substantially parallel to the front surface of the semiconductor substrate 11. A crystal defect density of the crystal defect region 30 is higher than a crystal defect density of a region other than the crystal defect region 30, of the IGBT drift region 56. The IGBT drift region 56 is formed continuous with a diode drift region 26 that will be described later.

The collector region 58 is a p-type semiconductor region that is formed on a lower side of the IGBT drift region 56. The collector region 58 is separated from the body region 54 by the IGBT drift region 56. Also, a lower surface of the collector region 58 is exposed on a back surface of the semiconductor substrate 11. The lower surface (back surface) of the collector region 58 is ohmically connected to the back surface electrode, not shown.

A portion of each of the two gate trenches 12 is formed in the IGBT region 50. The gate trench 12 is formed passing through the emitter region 52 and the body region 54 from the front surface of the semiconductor substrate 11. A lower end portion of the gate trench 12 protrudes into the IGBT drift region 56 from a lower end portion of the body region 54. Also, as described above, the trench gate electrode 16 that is covered by the gate insulating film 14 is formed inside the gate trench 12. An upper surface of the trench gate electrode 16 is covered by an insulating layer, not shown, and is thus insulated from the front surface electrode. However, the trench gate electrode 16 is electrically connected to an external device at a position that is not shown. Further, the trench gate electrode 16 is also electrically connected to a specific semiconductor region 22 that will be described later.

Also, a portion of the dummy trench 42 is also formed in the IGBT region 50. The dummy trench 42 is formed between the two gate trenches 12. The dummy trench 42 is also formed passing through the emitter region 52 and the body region 54 from the front surface of the semiconductor substrate 11. A lower end portion of the dummy trench 42 also protrudes into the IGBT drift region 56 from a lower end portion of the body region 54. Also, as described above, the dummy electrode 46 that is covered by the dummy insulating film 44 is formed inside the dummy trench 42. An upper surface of the dummy electrode 46 is also covered by an insulating film, not shown, and is thus insulated from the front surface electrode. However, the dummy electrode 46 is not electrically connected to an external device.

Figure 2:
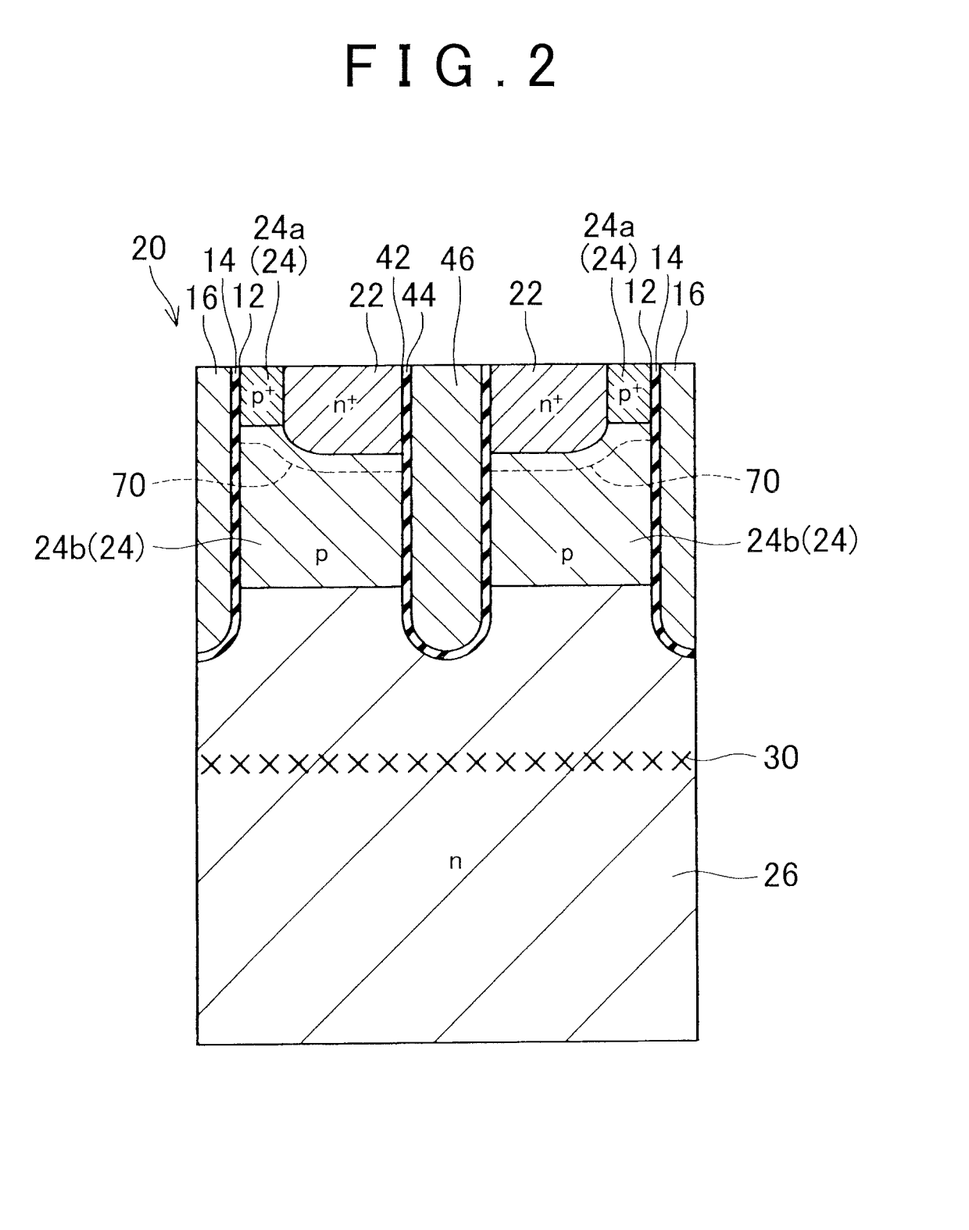
FIG. 2 is a sectional view taken along line II-II in FIG. 1.

Now, the diode region 20 will be described with reference to FIG. 2. FIG. 2 is a sectional view take along line II-II in FIG. 1, and is a view of a cross section of the semiconductor substrate 11 cut along a plane orthogonal to the longitudinal direction of the gate trench 12 in the diode region 20. A specific semiconductor region 22, an anode region 24, a diode drift region 26, two trench gate electrodes 16, and a dummy electrode 46 are formed in the diode region 20.

The specific semiconductor region 22 is an $n^+$-type semiconductor region that is formed in a portion of an area facing the front surface of the semiconductor substrate 11. The specific semiconductor region 22 is formed in an area that contacts the dummy insulating film 44 inside the dummy trench 42. However, the specific semiconductor region 22 is not formed in an area that contacts the gate insulating film 14 in the gate trench 12. The specific semiconductor region 22 is separated from the diode drift region 26 by the anode region 24. The specific semiconductor region 22 is electrically connected to the trench gate electrodes 16 by metal wiring, not shown. Also, in this example embodiment, two of the specific semiconductor regions 22 are formed in positions facing each other across the dummy trench 42, as shown in FIG. 1.

As shown in FIG. 2, the anode region 24 is a p-type semiconductor region that is formed on a portion (a portion other than the specific semiconductor region 22) in an area facing the front surface of the semiconductor substrate 11, and is formed along the lower side of the specific semiconductor region 22. The anode region 24 includes a first anode region 24a formed in an area facing the front surface of the semiconductor substrate 11, and a second anode region 24b formed on a lower side of the first anode region 24a. A p-type impurity concentration in the first anode region 24a is higher than a p-type impurity concentration in the second anode region 24b. An upper surface of the first anode region 24a is ohmically connected to the front surface electrode, not shown. Also, a position of a lower end portion of the first anode region 24a is higher than a position of a lower end portion of the specific semiconductor region 22. A position of a lower end portion of the second anode region 24b is higher than a position of a lower end portion of the gate trench 12 and a position of a lower end portion of the dummy trench 42.

The diode drift region 26 is an n-type semiconductor region that is formed on a lower side of the anode region 24. A lower surface of the diode drift region 26 is exposed on a back surface of the semiconductor substrate 11. The lower surface (back surface) of the diode drift region 26 is ohmically connected to the back surface electrode, not shown. The diode drift region 26 is formed continuous with the IGBT drift region 56 described above. Therefore, a crystal defect region 30 that is continuous with the crystal defect region 30 in the IGBT drift region 56 is also formed in the diode drift region 26. The crystal defect region 30 in the diode drift region 26 is formed along a plane that is substantially parallel to the front surface of the semiconductor substrate 11, and a crystal defect density of this crystal defect region 30 is higher than a crystal defect density of a region other than the crystal defect region 30, of the diode drift region 26.

A portion of each of the two gate trenches 12 is also formed in the diode region 20. The gate trench 12 is formed passing through the anode region 24 (the first anode region 24a and the second anode region 24b) from the front surface of the semiconductor substrate 11. A lower end portion of the gate trench 12 protrudes into the diode drift region 26 from a lower end portion of the anode region 24. The same also applies to the gate insulating film 14 and the trench gate electrodes 16 inside the gate trench 12.

Also, a portion of the dummy trench 42 is also formed in the diode region 20. The dummy trench 42 is formed between the two gate trenches 12. The dummy trench 42 is also formed passing through the specific semiconductor region 22 and the anode region 24 (the second anode region 24b) from the front surface of the semiconductor substrate 11. A lower end portion of the dummy trench 42 also protrudes into the diode drift region 26 from the lower end portion of the anode region 24. The same also applies to the dummy insulating film 44 and the dummy electrode 46 inside the dummy trench 42.

Continuing on, the operation of the semiconductor device 10 according to this example embodiment will now be described. First, a case in which the diode region 20 is operated will be described. When voltage that makes the front surface electrode positive (i.e., when forward voltage is applied to the diode region 20 (reverse voltage is applied to the IGBT region 50)) is applied between the front surface electrode and the back surface electrode, the diode turns on. In this case, on-voltage is not applied to the trench gate electrodes 16. When the diode turns on, current flows from the front surface electrode to the back surface electrode via the anode region 24 (the first anode region 24a and the second anode region 24b) and the diode drift region 26.

When the voltage applied to the diode region 20 is switched from forward voltage to reverse voltage (i.e., forward voltage to the IGBT region 50) and on-voltage is applied to the trench gate electrodes 16, the diode turns off and the IGBT turns on. The operation of the IGBT will be described later. When the diode turns off, the diode region 20 performs a reverse recovery operation. That is, when forward voltage is applied, holes present in the diode drift region 26 are discharged to the front surface electrode, and when forward voltage is applied, electrons present in the diode drift region 26 are discharged to the back surface electrode. Accordingly, a recovery current flows to the diode. This recovery current attenuates over a short period of time, after which the current that flows to the diode becomes substantially zero. At this time, the crystal defect region 30 formed in the diode drift region 26 functions as a carrier recombination center. Therefore, when a reverse recovery operation of the diode region 20 is performed, most of the holes in the diode drift region 26 recombine with crystal defects in the crystal defect region 30 and disappear. As a result, with the semiconductor device 10, recovery current generated when the reverse recovery operation is performed is inhibited, so the switching speed of the semiconductor device 10 is able to be improved.

Also, as described above, the specific semiconductor region 22 is electrically connected to the trench gate electrodes 16. When on-voltage is applied to the trench gate electrodes 16, the same potential as that of the trench gate electrodes 16 is applied to the specific semiconductor region 22. As a result, while the diode is off and the IGBT is on, a depletion layer 70 extends from a boundary of the specific semiconductor region 22 and the anode region 24 toward the anode region 24, as shown in FIG. 2. This depletion layer 70 is formed extending between the dummy trench 42 and the gate trench 12. Therefore, while the diode is off and the IGBT is on, even if some carriers (holes) flow into the anode region 24 (the second anode region 24b) from the diode drift region 26, movement of the holes into the first anode region 24a is blocked by the depletion layer 70. Thus, with the semiconductor device 10 according to this example embodiment, the generation of leak current is able to be inhibited.

Also, as described above, in this example embodiment, the crystal defect region 30 is formed in the diode drift region 26, but even if carriers (holes) are generated from the crystal defect region 30 due to a temperature increase or the like, movement of the holes is blocked by the depletion layer 70 that is formed between the specific semiconductor region 22 and the anode region 24. Therefore, the semiconductor device 10 of this example embodiment is able to inhibit the generation of leak current, while improving the switching speed.

Also, in this example embodiment, as described above, the position of the lower end portion of the specific semiconductor region 22 is lower than the position of the lower end portion of the first anode region 24a. Therefore, while the diode is off and the IGBT is on, the depletion layer 70 that is formed between the specific semiconductor region 22 and the anode region 24 easily forms below the first anode region 24a (see FIG. 2). As a result, holes are able to be inhibited from flowing into the first anode region 24a while the diode is off and the IGBT is on.

Further, the same potential as that of the trench gate electrodes 16 is applied to the specific semiconductor region 22, but because the specific semiconductor region 22 is formed in an area that is not adjacent to the gate insulating film 14 in the diode region 20, a channel will not be formed in the diode region 20 when the IGBT region 50 is turned on (i.e., when an on-potential is applied to the trench gate electrodes 16). Therefore, even if the same potential as that of the trench gate electrodes 16 is applied to the specific semiconductor region 22, the semiconducting properties of the IGBT region 50 are able to be inhibited from being affected by this.

Continuing on, a case in which the IGBT region 50 is operated will be described. As described above, when voltage that makes the back surface electrode positive (i.e., when forward, voltage is applied to the IGBT region 50 (reverse voltage is applied to the diode region 20)) is applied between the front surface electrode and the back surface electrode, and an on-potential is applied to the trench gate electrodes 16, the IGBT turns on. That is, a channel is formed in the body region 54 in an area contacting the gate insulating film 14, by the application of the on-potential to the trench gate electrodes 16. When this happens, electrons flow from the front surface electrode to the back surface electrode via the emitter region 52, the channel, the IGBT drift region 56, and the collector region 58. Also, holes flow from the back surface electrode to the front surface electrode via the collector region 58, the IGBT drift region 56, and the body region 54. That is, current flows from the back surface electrode to the front surface electrode.

When the potential applied to the trench gate electrodes 16 is switched from the on-potential to an off-potential, the channel disappears. However, current (referred to as "tail current") continues to flow to the IGBT for a short period of time by the carriers remaining in the IGBT drift region 56. The tail current attenuates over a short period of time, and thereafter, the current that flows to the IGBT becomes substantially zero. Also, as described above, the crystal defect region 30 is also folioed in the IGBT drift region 56. The crystal defect region 30 of the IGBT drift region 56 functions as a carrier recombination center. Therefore, when the IGBT region 50 is off, most of the holes in the IGBT drift region 56 recombine with crystal defects in the crystal defect region 30 and disappear, thus enabling the switching speed of the semiconductor device 10 to be improved.

(Second Example Embodiment)

Next, a semiconductor device 100 according to a second example embodiment of the invention will be described with reference to FIGS. 3 and 4, with a focus on the differences from the semiconductor device 10 in the first example embodiment. With the semiconductor device 100 of this example embodiment, the structure of a diode region 120 is different from the structure of the diode region 20 in the first example embodiment. In this example embodiment, two specific semiconductor regions 122 are formed in positions not facing each other across the dummy trench 42, as shown in FIG. 3.

Figure 3:
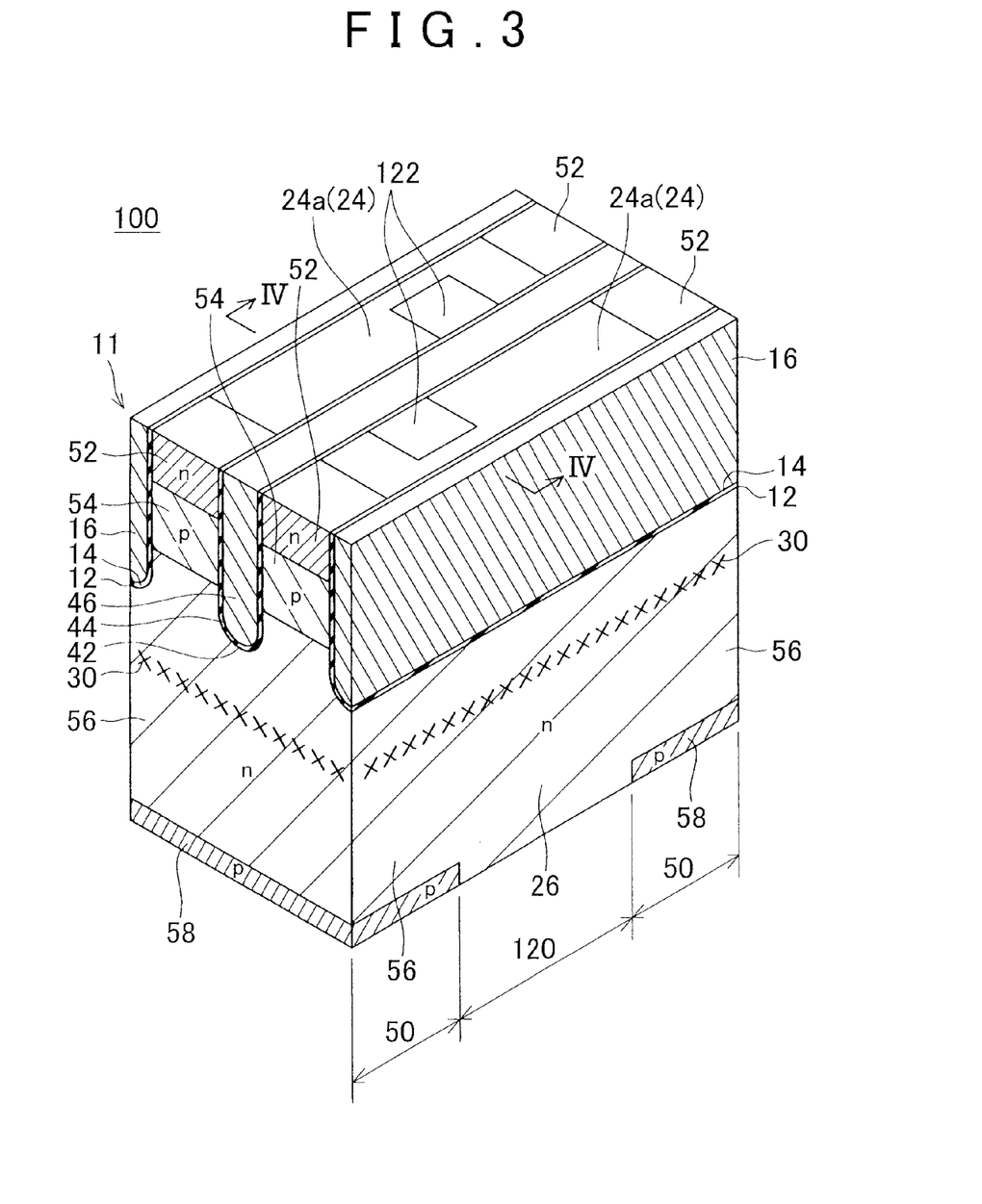
FIG. 3 is a sectional perspective view of the main portions of a semiconductor device according to a second example embodiment of the invention.
Figure 4:
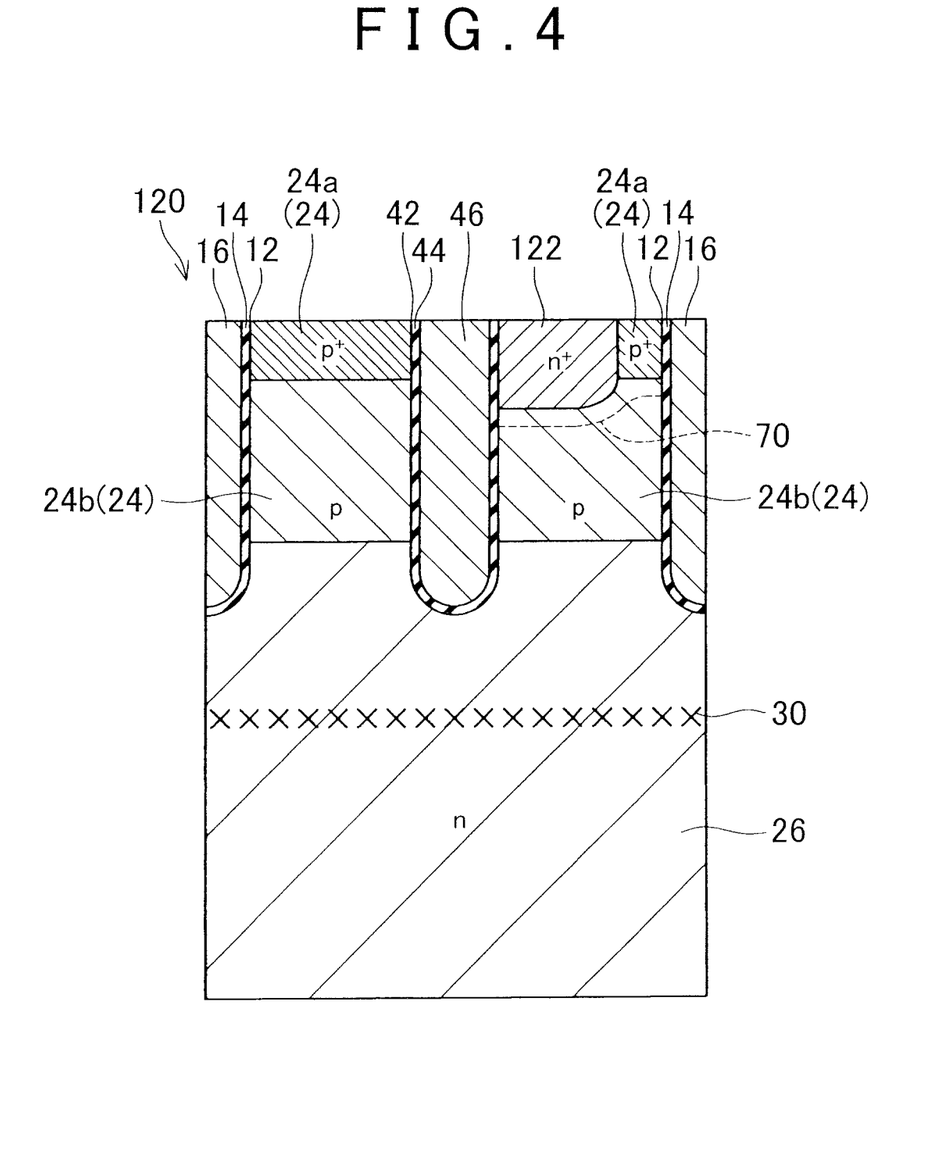
FIG. 4 is a sectional view taken along line IV-IV in FIG. 3.

FIG. 4 is a sectional view take along line IV-IV in FIG. 3, and is a view of a cross section of the semiconductor substrate 11 cut along a plane orthogonal to the longitudinal direction of the gate trench 12 in the diode region 120. In FIG. 4, the specific semiconductor regions 122 are formed only in an area contacting one side (the right side in the drawing) of the dummy insulating film 44 in the dummy trench 42. In FIG. 4, only the anode region 24 (the first anode region 24a and the second anode region 24b) is formed on the other side (the left side in the drawing) of the dummy insulating film 44 in the dummy trench 42.

The operation of the semiconductor device 100 according to this example embodiment is basically the same as the operation of the semiconductor device 10 according to the first example embodiment. Therefore, the semiconductor device 100 of this example embodiment is also able to display operation and effects substantially similar to those of the first example embodiment. In this example embodiment, the two specific semiconductor regions 122 are formed in positions not facing each other across the dummy trench 42 (see FIG. 3). That is, in the cross section in FIG. 4, while the diode region 120 is off and the IGBT region 50 is on, the depletion layer 70 is formed only on one side (the right side in the drawing) of the dummy insulating film 44 in the dummy trench 42. Therefore, while the diode region 120 is off and the IGBT region 50 is on, even if some of the holes that flow from the diode drift region 26 into the anode region 24 are discharged to the front surface electrode from the anode region 24 where the depletion layer 70 is not formed, the holes are able to be inhibited from passing in concentration through some regions. Therefore, the generation of heat due to leak current flowing in concentration to some regions is able to be inhibited.

(Third Example Embodiment)

Next, a semiconductor device 200 according to a third example embodiment of the invention will be described with reference to FIGS. 5 and 6, with a focus on the differences from the first example embodiment. First, the semiconductor device 200 in this example embodiment differs from the semiconductor device 10 in the first example embodiment in that a dummy trench is not formed between the two gate trenches 12. Accordingly, the structure of a diode region 220 also differs from the structure of the diode region 20 in the first example embodiment. That is, in this example embodiment, one specific semiconductor region 222 is formed between the two gate trenches 12, as shown in FIG. 5.

Figure 5:
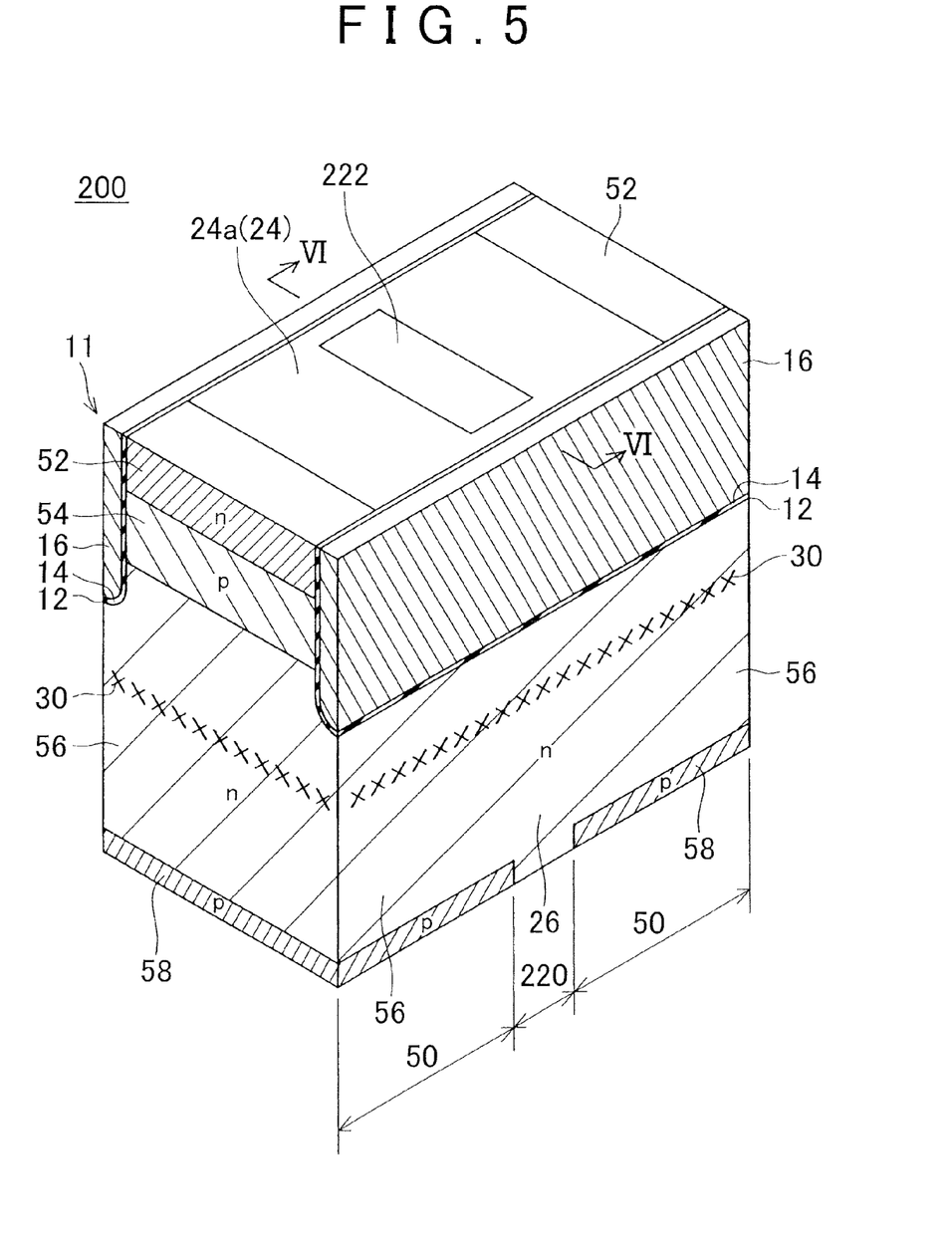
FIG. 5 is a sectional perspective view of the main portions of a semiconductor device according to a third example embodiment of the invention.
Figure 6:
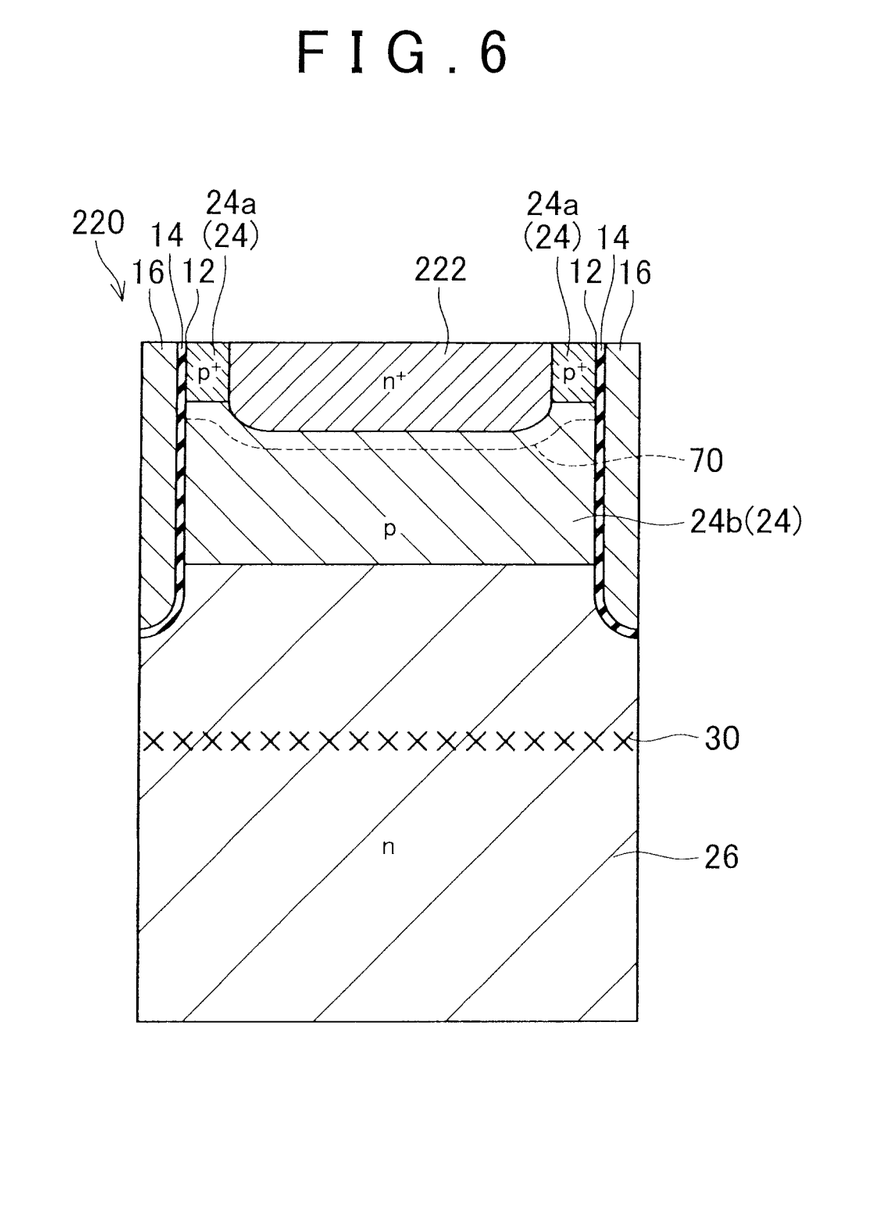
FIG. 6 is a sectional view taken along line VI-VI in FIG. 5.

FIG. 6 is a sectional view take along line VI-VI in FIG. 5, and is a view of a cross section of the semiconductor substrate 11 cut along a plane orthogonal to the longitudinal direction of the gate trench 12 in the diode region 220. As shown in FIG. 6, the specific semiconductor region 222 is formed in substantially the center between the two gate trenches 12.

The operation of the semiconductor device 200 according to this example embodiment is basically the same as the operation of the semiconductor device 10 according to the first example embodiment. That is, as shown in FIG. 6, while the diode region 220 is off and the IGBT region 50 is on, the depletion layer 70 is formed between the specific semiconductor region 222 and the anode region 24. At this time, the depletion layer 70 is formed extending between the two gate trenches 12. Therefore, the semiconductor device 200 of this example embodiment is also able to display operation and effects substantially similar to those of the first example embodiment.

Also, in this example embodiment, the semiconductor device 200 does not have a dummy trench. Therefore, the overall semiconductor device 200 is able to be smaller compared to when it has a dummy trench.

While the invention has been described with reference to specific embodiments thereof, these example embodiments are for illustrative purposes only and are not intended to limit the scope of the claims for patent. Various modifications and variations of the specific examples described above are also included in the technology described in the scope of the claims for patent. For example, the modified examples described below may also be employed.

(First Modified Example)

In the example embodiments described above, the gate trench 12, the gate insulating film 14, and the trench gate electrode 16 are all provided in both the IGBT region 50 and the diode region 20 (120, 220). The invention is not limited to this, however. For example, the gate trench 12, the gate insulating film 14, and the trench gate electrode 16 may be formed only in the IGBT region 50, and not formed in the diode region 20 (120, 220). In this case as well, it is sufficient to just have the specific semiconductor region 22 (122, 222) in the diode region 20 (120, 220) be formed in an area not adjacent to the gate insulating film 14, and electrically connected to the trench gate electrode 16 in the IGBT region 50. The semiconductor device according to this modified example is also able to display operation and effects similar to those of the example embodiments described above.

(Second Modified Example)

In the example embodiments described above, the crystal defect region 30 is formed in the IGBT drift region 56 and in the diode drift region 26. The invention is not limited to this, however. For example, the crystal defect region 30 may also be omitted. In this case, the on-voltage of the semiconductor device is able to be lower than it can when the crystal defect region 30 is formed.

(Third Modified Example)

In the example embodiments described above, the anode region 24 has two regions, i.e., the first anode region in which the p-type impurity concentration is high, and the second anode region in which the p-type impurity concentration is low. The invention is not limited to this, however. For example, the anode region 24 may also be formed with a single impurity concentration.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor device including a semiconductor substrate, comprising:

an IGBT region that includes a first conductive type emitter region formed in an area facing a front surface of the semiconductor substrate, a second conductive type body region formed on a lower side of the emitter region, a first conductive type IGBT drift region formed on a lower side of the body region, a gate insulating film that covers an inside wall of a gate trench extending from the front surface of the semiconductor substrate to the IGBT drift region, and contacts the emitter region, and a trench gate electrode arranged inside the gate insulating film; and a diode region that includes a first conductive type specific semiconductor region that is formed in a portion of an area facing the front surface of the semiconductor substrate and is electrically connected to the trench gate electrode, a second conductive type anode region that is formed in another portion of the area facing the front surface of the semiconductor substrate and is formed along a lower side of the specific semiconductor region, and a first conductive type diode drift region that is formed on a lower side of the anode region and is separated from the specific semiconductor region by the anode region.

2. The semiconductor device according to claim 1, wherein the gate insulating film and the trench gate electrode are formed along the IGBT region and the diode region; and the specific semiconductor region is formed in an area not adjacent to the gate insulating film in the diode region.

3. The semiconductor device according to claim 1, wherein the anode region includes a first anode region formed in at least a part of the other portion of the area facing the front surface of the semiconductor substrate, and a second anode region formed on a lower side of the first anode region;

a second conductive type impurity concentration of the first anode region is higher than a second conductive type impurity concentration of the second anode region; and a position of a lower end portion of the specific semiconductor region is lower than a position of a lower end portion of the first anode region.

4. The semiconductor device according to claim 1, wherein a crystal defect region is formed in the diode drift region, the crystal defect region having a crystal defect density that is higher than a crystal defect density of a region other than the crystal defect region of the diode drift region.

* * * * *